US008418799B2

(12) United States Patent
Richter et al.

(10) Patent No.: US 8,418,799 B2

(45) Date of Patent: Apr. 16, 2013

(54) COOLING SYSTEM FOR A THERMOELECTRIC POWER GENERATOR

(75) Inventors: Rainer Richter, Munich (DE); Boris Mazar, Munich (DE); Stefan Rueth, Garching (DE); Gunter Schroeter, Munich (DE); Stefan Muench, Odelzhausen (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 85 days.

(21) Appl. No.: 12/944,832

(22) Filed: Nov. 12, 2010

(65) Prior Publication Data

US 2011/0083831 A1 Apr. 14, 2011

Related U.S. Application Data

(63) Continuation of application No. PCT/EP2009/002884, filed on Apr. 21, 2009.

(30) Foreign Application Priority Data

May 15, 2008 (DE) ........................ 10 2008 023 832

(51) Int. Cl.
*B60K 13/04* (2006.01)
*B60K 6/00* (2007.10)

(52) U.S. Cl.
USPC .......................... 180/309; 180/65.31; 60/320

(58) Field of Classification Search ............. 180/65.275, 180/65.31, 309; 60/320, 324, 272; 165/120
See application file for complete search history.

(56) References Cited

U.S. PATENT DOCUMENTS

| | | | | |
|---|---|---|---|---|
| 3,052,316 | A * | 9/1962 | Froberger | 184/109 |
| 6,272,873 | B1 | 8/2001 | Bass | |
| 7,100,369 | B2 * | 9/2006 | Yamaguchi et al. | 60/324 |
| 7,246,487 | B2 * | 7/2007 | Hara | 60/298 |
| 7,426,910 | B2 | 9/2008 | Elwart | |
| 7,608,777 | B2 * | 10/2009 | Bell et al. | 136/200 |
| 2009/0126772 | A1 * | 5/2009 | Machida | 136/222 |

FOREIGN PATENT DOCUMENTS

| | | | |
|---|---|---|---|
| DE | 10 2006 019 282 | A1 | 10/2007 |
| DE | 10 2007 051 164 | A1 | 5/2008 |
| EP | 1 475 532 | A2 | 11/2004 |
| EP | 1 811 646 | A1 | 7/2007 |
| WO | WO 2007/002891 | A2 | 1/2007 |

OTHER PUBLICATIONS

German Search Report dated Apr. 29, 2009 including partial English-language translation (Nine (9) pages).
International Search Report dated Jul. 22, 2009 including English-language translation (Four (4) pages).

* cited by examiner

*Primary Examiner* — John Walters
(74) *Attorney, Agent, or Firm* — Crowell & Moring LLP

(57) ABSTRACT

A cooling system is provided for a thermoelectric power generator and that is arranged in an exhaust gas line of an internal combustion engine for generating electric power while utilizing thermal energy of the exhaust gas. The thermoelectric power generator has its own coolant circuit, which also serves to raise the temperature of the components of the internal combustion engine, the chassis, and/or the transmission or serves to heat the passenger compartment. This offers the added utility gained from a faster temperature rise of transmission lubricants and lubricants of the internal combustion engine, as well as from heating the passenger compartment and the rear axle differential and, thus, offers a reduction of carbon dioxide emissions ($CO_2$).

10 Claims, 1 Drawing Sheet

Thermoelectric Power Generator Cooling System
TEG
Motor
MSD
NSD

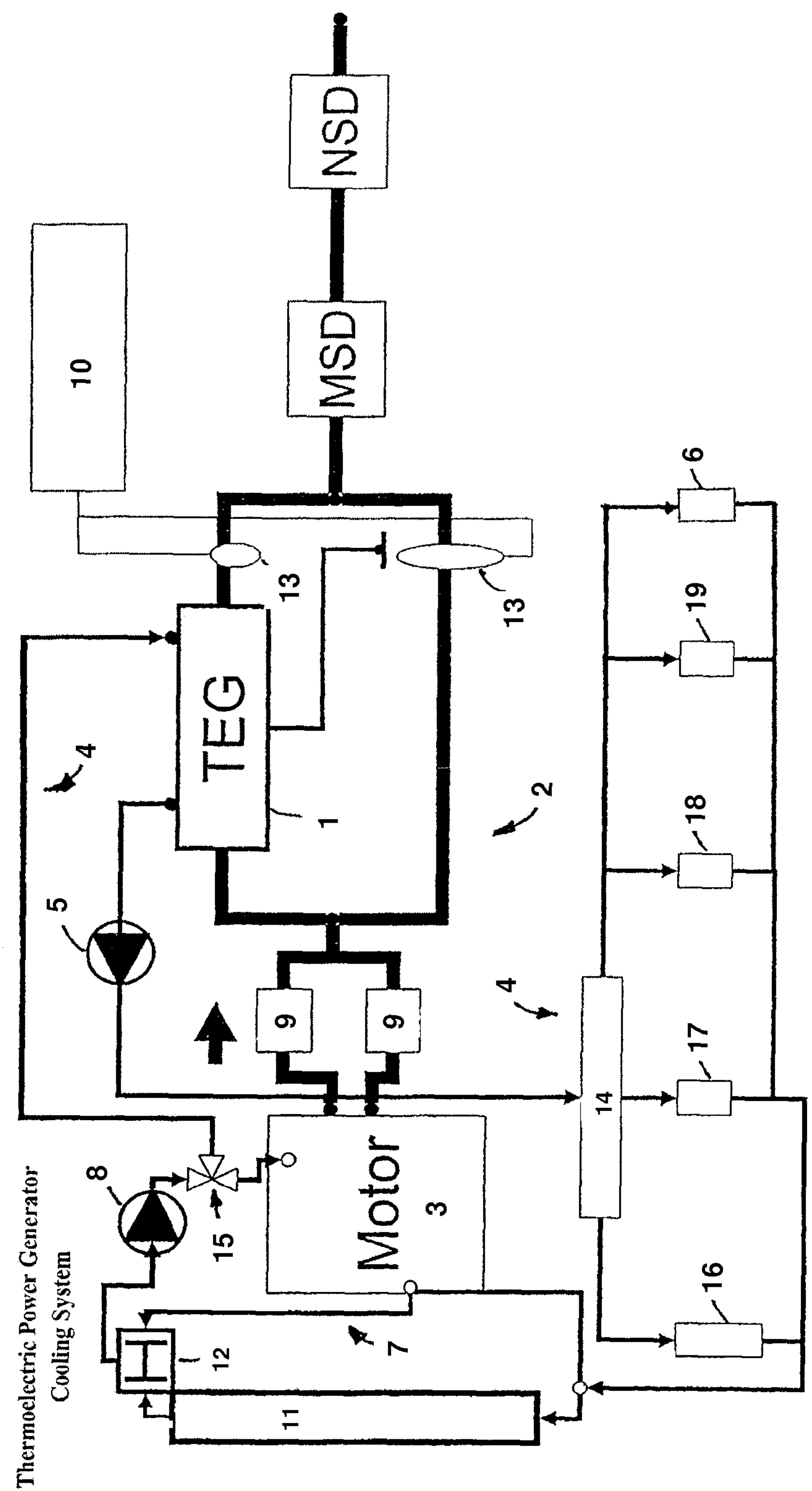
NSD
MSD
10
TEG
1
2
4
5
6
19
18
17
16
14
13
9
Motor
3
8
15
7
12
11
Thermoelectric Power Generator Cooling System

COOLING SYSTEM FOR A THERMOELECTRIC POWER GENERATOR

CROSS-REFERENCE TO RELATED APPLICATIONS

This application is a continuation of PCT International Application No. PCT/EP2009/002884, filed Apr. 21, 2009, which claims priority under 35 U.S.C. §119 from German Patent Application No. DE 10 2008 023 832.5, filed May 15, 2008, the entire disclosures of which are herein expressly incorporated by reference.

This application contains subject matter related to U.S. application Ser. No. 12/944,795, entitled "Exhaust Gas System for an Internal Combustion Engine" filed on Nov. 12, 2010.

BACKGROUND AND SUMMARY OF THE INVENTION

The invention relates to a cooling system that is intended for a thermoelectric power generator (TEG) that is arranged in an exhaust gas line of an internal combustion engine for generating electric power while utilizing the thermal energy of the exhaust gas.

The relevant prior art includes, for example, the German published patent application DE 10 2006 019 282 A1, which discloses an exhaust gas recirculation system that is provided for an internal combustion engine and includes an exhaust gas line and a fresh air line. In this case, the exhaust gas line and the fresh air line are connected in an exhaust gas conveying manner to an exhaust gas recirculation line. The exhaust gas recirculation line has an exhaust gas cooler, on which a thermoelectric power generator (TEG) is arranged with its hot side, in order to generate electric power. The proposed configuration provides an additional power generator with minimal effort and complexity. In order to have an adequate temperature gradient constantly on hand for generating electric power, the TEG is integrated on its cold side into the coolant circuit of the internal combustion engine.

European patent application EP 1 475 532 A2 also discloses an internal combustion engine having an intake line and an exhaust gas line. This internal combustion engine also has an exhaust gas recirculation system, with which the exhaust gas from the exhaust gas line can be fed back into the fresh air line through an exhaust gas recirculation line. This exhaust gas recirculation line also has a thermoelectric power generator (TEG), of which the hot side is arranged on the exhaust gas recirculation line, in order to generate electric power. In one special embodiment, the TEG has its own dedicated coolant circuit, which is intended for simultaneously cooling an electric inverter. The inverter, in turn, serves to control the speed of an electric engine, which can be operated alternatingly or simultaneously with the internal combustion engine, a so-called hybrid drive for motor vehicles.

Even if the cited prior art does not reveal any fundamental disadvantage, the object of the present invention is to utilize more efficiently the thermal energy of the exhaust gas.

This and other objects are achieved with a cooling system for a thermoelectric power generator that is arranged in an exhaust gas line of an internal combustion engine for generating electric power while utilizing the thermal energy of the exhaust gas. The TEG has its own coolant circuit, wherein the coolant circuit is provided for raising the temperature of the components of the internal combustion engine, the chassis, the transmission, and/or heating the passenger compartment.

Owing to the inventive configuration, the TEG represents in the final end an expanded exhaust gas heat exchanger. Therefore, in addition to its main function, that is, the generation of electric energy, there are also additional functionalities because of the uncoupling of the heat from the exhaust gas. These functionalities involve predominantly the cold start or rather the low load phases of the internal combustion engine. During these phases, the temperature of the transmission or rather the rear axle differential rises very slowly. The following functions for a faster temperature rise exist because of the TEG:

(a) promote the temperature rise of a passenger compartment of a vehicle by supplemental heating with the coolant circuit;

(b) fast temperature rise of the transmission lubricant with the coolant circuit;

(c) promote the temperature rise of the lubricant of the internal combustion engine and/or the components of the internal combustion engine and, thus, faster warm-up of the internal combustion engine; and (d) fast temperature rise of the chassis components, such as the rear axle differential, by means of its lubricant.

In this respect, the distribution of the heat flows in the coolant circuit can ensue, for example, in a centralized system, by means of, for example, a multifunctional valve or in a decentralized system by means of a mono valve or a 2/2 way valve, as used, for example, in an integrated heating and air conditioning device. The result of the embodiment according to the invention is a significantly higher electric power output of the TEG and the possibility of operating the inventive design more flexibly than is the case with a TEG air cooling system. Reducing the load on the electric power generator reduces in an advantageous way the fuel consumption (reduction in $CO_2$ emissions).

According to aspects of the invention, the major advantages lie in the added utility gained from a faster temperature rise of, for example, the transmission lubricants and the lubricants of the internal combustion engine, as well as from heating the passenger compartment. The inventive design also contributes in an advantageous way to a faster temperature rise of the TEG and slows down the cooling rate of the TEG at low load points.

In an especially preferred design variant for the cooling system of a TEG, a coolant pump and a heat exchanger are arranged in the coolant circuit.

In another embodiment, the coolant pump can be driven electrically or mechanically. This makes it possible to avoid "reheating" the TEG due to the after-flow of the coolant pump and, thus, a potential overheating of the TEG.

Preferred location sites for the heat exchanger include, for example, an internal combustion engine chamber, in a wheel assembly, and/or under the floor of a vehicle chassis.

In yet another embodiment, the internal combustion engine has a primary coolant circuit, wherein the coolant is operatively connected to the primary coolant circuit. In an advantageous way, this embodiment dispenses with the alternative throttling of the TEG coolant circuit by means of the coolant pump of the internal combustion engine.

Other objects, advantages and novel features of the present invention will become apparent from the following detailed description of one or more preferred embodiments when considered in conjunction with the accompanying drawing.

BRIEF DESCRIPTION OF THE DRAWING

FIG. 1 is a schematic diagram of a thermoelectric power generator (TEG) that is cooled according to an embodiment of the invention and that is integrated into an exhaust gas line of an internal combustion engine.

DETAILED DESCRIPTION OF THE DRAWING

The term thermoelectric power generator (TEG) is defined not only as a single TEG, but can also be defined as an arrangement of several TEG's in one block or any other arrangement. The operating principle and mode of action of a TEG will not be discussed in detail below, since they are sufficiently well-known from the prior art. Similarly there will be no explicit discussion of the general concept of how the TEG is electrically integrated.

FIG. 1 is a schematic diagram showing the integration of a thermoelectric power generator (TEG) 1, which is cooled, into an exhaust gas line 2, arranged on an internal combustion engine 3. The exhaust gas line 2 is configured as a dual pipe system in close proximity to the internal combustion engine. As a result, each branch of the exhaust gas line has an exhaust gas purification system 9. In the direction of flow of the exhaust gas, downstream of the exhaust gas purification systems 9, the exhaust gas branches empty into a common exhaust gas line 2, which then splits again into two exhaust gas branches, so that the hot side of the thermoelectric power generator 1 is arranged in one branch of the exhaust gas line. Both exhaust gas branches are dimensioned preferably such that the maximum exhaust gas mass flow can be conveyed through each exhaust gas branch.

Each of the two exhaust gas branches has an exhaust gas valve 13. In the present case, the exhaust gas valve 13 is arranged behind the thermoelectric power generator 1. Downstream of the exhaust gas valves 13, the exhaust gas branches empty again into the common exhaust gas line 2. In the direction of flow of the exhaust gas, first a central muffler (MSD) and then a rear muffler (NSD), are integrated into the exhaust gas line 2.

The exhaust gas valves 13 can be controlled by way of a control unit 10 as a function of the operating state of the internal combustion engine 3. Furthermore, the internal combustion engine 3 has a primary coolant circuit 7 with a first coolant pump 8 and a first heat exchanger 11 and a thermostat valve 12 for controlling the temperature of the internal combustion engine 3.

In an additional embodiment, the exhaust gas valve 13 may also be arranged upstream of the thermoelectric power generator 1 in the direction of flow of the exhaust gas. One example of the exhaust gas valve 13 that may be used is an exhaust gas flap or a rotary slide valve or any other shut-off element. Moreover, the exhaust gas line 2 can also be configured as a single pipe system in close proximity to the internal combustion engine downstream of the exhaust gas manifold. Even the arrangement of the exhaust gas purification systems 9 may deviate from the illustrated embodiment. The control unit 10 may also be, for example, a control unit for the internal combustion engine 3.

In order to cool the thermoelectric power generator 1, the cold side of the thermoelectric power generator has its own coolant circuit 4. This coolant circuit 4 has a second coolant pump 5 and a valve 14, in the present embodiment a multi-functional valve, such as that known from integrated heating and air conditioning units. A coolant, which is heated by the thermoelectric power generator 1, can be conveyed through the valve 14 to a second heat exchanger 6 for the purpose of raising the temperature of the components of the internal combustion engine, the chassis, the transmission and/or heating a passenger compartment.

As an alternative to the second heat exchanger 6, the present embodiment provides a third heat exchanger 16 for a component of an internal combustion engine, such as a lubricant container; a fourth heat exchanger 17 for a chassis component, such as a rear axle differential; a fifth heat exchanger 18 for a transmission component, such as the transmission lubricant; and a sixth heat exchanger 19 for a passenger compartment of a vehicle.

In the embodiment depicted in FIG. 1, the coolant circuit 4 of the thermoelectric power generator 1 is also connected in a coolant-conveying manner to the primary coolant circuit 7 of the internal combustion engine 3.

Owing to the inventive configuration, the TEG represents in the final end an expanded exhaust gas heat exchanger. Therefore, in addition to its main function, that is, the generation of electric energy, there are also additional functionalities because of the uncoupling of the heat from the exhaust gas. These functionalities involve predominantly the cold start or rather the low load phases of the internal combustion engine. During these phases, the temperature of the transmission or rather the rear axle differential rises very slowly. The following functions for a faster temperature rise exist because of the TEG:

(a) promote the temperature rise of a passenger compartment of a vehicle by supplemental heating with the coolant circuit;

(b) fast temperature rise of the transmission lubricant with the coolant circuit;

(c) promote the temperature rise of the lubricant of the internal combustion engine and/or the components of the internal combustion engine and, thus, faster warm-up of the internal combustion engine; and (d) fast temperature rise of the chassis components, such as the rear axle differential, by means of its lubricant.

TABLE OF REFERENCE NUMERALS

1. thermoelectric power generator (TEG)
2. exhaust gas line
3. internal combustion engine
4. coolant circuit
5. second coolant pump
6. second heat exchanger
7. primary coolant circuit
8. first coolant pump
9. exhaust gas purification system
10. control unit
11. first heat exchanger
12. thermostat valve
13. exhaust gas valve
14. valve
15. mixing valve
16. third heat exchanger internal combustion engine component
17. fourth heat exchanger chassis component
18. fifth heat exchanger transmission component
19. sixth heat exchanger passenger compartment The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A cooling system for a thermoelectric power generator arranged in an exhaust gas line of an internal combustion engine for generating electric power, the cooling system comprising:

a coolant circuit provided for the thermoelectric power generator, wherein the coolant circuit comprises a first coolant pump operatively arranged between the thermoelectric power generator and a first heat exchanger, wherein the coolant circuit is operatively configured for at least one of:

(a) increasing a temperature of components of the internal combustion engine, (b) increasing a temperature of a chassis of the vehicle, (c) increasing a temperature of a transmission of the vehicle, and (d) heating a passenger compartment of the vehicle; and a primary coolant circuit operatively configured for the internal combustion engine, wherein the primary coolant circuit comprises a second coolant pump operatively arranged between the internal combustion engine and a second heat exchanger, wherein the coolant circuit provided for the thermoelectric power generator is operatively coupled to the primary coolant circuit.

2. The cooling system according to claim 1, wherein the first coolant pump is driven electrically or mechanically.

3. The cooling system according to claim 2, wherein the first heat exchanger is arranged in at least one of an internal combustion engine chamber, a wheel assembly, and under a floor of the chassis of the vehicle.

4. The cooling system according to claim 1, wherein the first heat exchanger is arranged in at least one of an internal combustion engine chamber, a wheel assembly, and under a floor of the chassis of the vehicle.

5. The cooling system according to claim 1, wherein the coolant circuit for the thermoelectric power generator is operatively configured to heat a passenger compartment of the vehicle.

6. A method of operating a cooling system for a thermoelectric power generator, the method comprising the acts of:

cooling the thermoelectric power generator, arranged in an exhaust gas line of an internal combustion engine for generating electric power, via a coolant circuit operatively configured for the thermoelectric power generator arranging, within the coolant circuit, a first coolant pump between the thermoelectric power generator and a first heat exchanger; and utilizing the coolant circuit for the thermoelectric power generator to at least one of:

(a) raise a temperature of components of the internal combustion engine, (b) raise a temperature of a chassis of the vehicle, (c) raise a temperature of a transmission of the vehicle, and (d) heat a passenger compartment of the vehicle;

providing a primary coolant circuit for the internal combustion engine;

arranging, within the primary coolant circuit, a second coolant pump between the internal combustion engine and a second heat exchanger; and coupling the coolant circuit provided for the thermoelectric power generator to the primary coolant circuit.

7. The method according to claim 6, wherein the raising of the temperature of the transmission includes the act of providing a temperature rise of a transmission lubricant.

8. The method according to claim 6, wherein the raising of the temperature of the chassis of the vehicle provides a temperature rise of a rear axle differential via a lubricant of the rear axle differential.

9. The method according to claim 6, wherein the raising of the temperature of the components of the internal combustion engine provides a warm-up of the internal combustion engine.

10. The method according to claim 6, wherein the coolant circuit for the thermoelectric power generator is utilized to heat a passenger compartment of the vehicle.

* * * * *